United States Patent
Lin

(10) Patent No.: US 7,047,433 B2
(45) Date of Patent: May 16, 2006

(54) METHOD AND CIRCUIT FOR SYNCHRONIZING A HIGHER FREQUENCY CLOCK AND A LOWER FREQUENCY CLOCK

(75) Inventor: Chih-wen Lin, Kaohsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 566 days.

(21) Appl. No.: 10/455,372

(22) Filed: Jun. 6, 2003

(65) Prior Publication Data

US 2004/0199802 A1    Oct. 7, 2004

(51) Int. Cl.
 *G06F 1/12*    (2006.01)

(52) U.S. Cl. ............... 713/400; 713/500; 713/501; 713/502

(58) Field of Classification Search ............ 713/400, 713/500, 501, 502, 503

See application file for complete search history.

(56) References Cited

U.S. PATENT DOCUMENTS

| | | | | |
|---|---|---|---|---|
| 5,459,855 A | * | 10/1995 | Lelm | 713/400 |
| 6,396,887 B1 | * | 5/2002 | Ware et al. | 375/354 |
| 6,711,696 B1 | * | 3/2004 | Bates et al. | 713/600 |
| 6,784,716 B1 | * | 8/2004 | Meguro | 327/298 |

* cited by examiner

*Primary Examiner*—Lynne H. Browne
*Assistant Examiner*—Paul Yanchus
(74) *Attorney, Agent, or Firm*—Winston Hsu

(57) ABSTRACT

A higher frequency clock and a lower frequency clock are locked at a predetermined phase relationship. A total number of pulses of the higher frequency clock occurring between two sequential rising edges of the lower frequency are calculated. A count start signal is generated in response to a rising edge of the lower frequency clock. A value of a lower frequency clock count is set in response to the count start signal. The value of the lower frequency clock decrements in accordance with a frequency of the higher frequency clock. When the value of the lower frequency clock has decreased by the total number of pulses of the higher frequency clock occurring between two consecutive rising edges of the lower frequency minus 1, a synchronization signal is generated for indicating occurrence of the predetermined phase relationship between the higher frequency clock and the lower frequency clock.

12 Claims, 5 Drawing Sheets

METHOD AND CIRCUIT FOR SYNCHRONIZING A HIGHER FREQUENCY CLOCK AND A LOWER FREQUENCY CLOCK

BACKGROUND OF THE INVENTION

1. Field of the Invention

The present invention relates to a method of synchronizing dual clock frequencies and, more particularly, to a method of synchronizing a relatively high frequency clock and a relatively low frequency clock applied to various components of a computer system through generating a synchronization signal.

2. Description of the Related Art

In today's computer system, for exhibiting a better performance, a microprocessor of the computer system is operated at the highest possible frequency while other components of the computer system are operated at a lower frequency limited by the system board technology. More specifically, as shown in FIG. 1(a), a general computer system 10 mainly includes a microprocessor 11, an input/output (I/O) device 12 for allowing a computer user to communicate information and commands to the microprocessor 11, a display device 13 for displaying information to the computer user, a data storage device 14 for storing information, and an external memory 15 for storing instructions and data used by the microprocessor 11.

The microprocessor 11 is operated in accordance with a core clock having a higher frequency, and is coupled to a system bus 16. The system bus 16 includes the address, data, and control lines necessary for transferring data between various constituting blocks of the computer system 10. All of the I/O device 12, the display device 13, the data storage device 14, and the external memory 15 are also coupled to the system bus 16. On the system bus 16, the information is transferred in accordance with a bus clock having a lower frequency than that of the core clock. Furthermore, all of the I/O device 12, the display device 13, the data storage device 14, and the external memory 15 coupled to the system bus 16 are operated in accordance with the bus clock having the lower frequency.

Therefore, it has become a very important subject in the field of digital signal processing technology: how to synchronize the data transfer between the microprocessor operated in accordance with the higher frequency core clock and the other components operated in accordance with the lower frequency bus clock.

FIG. 1(b) shows an example of a conventional method of synchronizing dual clock frequencies. Referring to FIG. 1(b), the bus clock BUS_CK is supplied to a bus device 20 as a clock frequency used therein, and is input to a phase-locked loop 21 of the microprocessor 11 for generating the core clock CORE_CK. The core clock CORE_CK is used as a clock frequency inside the microprocessor 11. A core 22 of the microprocessor 11 is provided with two clock trees 23 and 24, to which the core clock CORE_CK and the bus clock BUS_CK are applied, respectively. A synchronization circuit 25 makes the core clock CORE_CK and the bus clock BUS_CK synchronized. This conventional method has a drawback regarding with the necessary use of two clock trees 23 and 24.

FIG. 1(c) shows another example of a conventional method of synchronizing dual clock frequencies. Referring to FIG. 1(c), a frequency divider 26 makes the core clock CORE_CK divided by N to thereby generate the bus clock BUS_CK for the bus device 20. In addition, the frequency divider 26 outputs a bus clock enable signal BUSCK_EN to the microprocessor 11. However, in normal application of the phase-locked loop instead of the frequency divider 26, there is no way to generate the bus clock enable signal BUSCK_EN by employing this conventional method.

SUMMARY OF THE INVENTION

In view of the above-mentioned problem, an object of the present invention is to provide a method of synchronizing dual clock frequencies so as to generate a synchronization signal for a higher frequency clock and a lower frequency clock, such that higher frequency devices operated in accordance with the higher frequency clock and lower frequency devices operated in accordance with the lower frequency clock achieves synchronous data transfer with each other.

According to an aspect of the present invention, a method of synchronizing a higher frequency clock and a lower frequency clock comprising the following steps. The higher frequency clock and the lower frequency clock are locked at a predetermined phase relationship. A total number of pulses of the higher frequency clock occurring between two consecutive rising edges of the lower frequency clock are calculated. A count start signal is generated in response to a rising edge of the lower frequency clock. A value of a lower frequency clock count is set in response to the count start signal. The value of the lower frequency clock count decrements in accordance with a frequency of the higher frequency clock. A synchronization signal is generated when the value of the lower frequency clock count has decreased by the total number of pulses of the higher frequency clock occurring between two consecutive rising edges of the lower frequency clock minus 1, for indicating occurrence of the predetermined phase relationship between the higher frequency clock and the lower frequency clock.

According to another aspect of the present invention, a circuit is provided to synchronize a higher frequency clock and a lower frequency clock by employing the method of synchronizing dual clock frequencies described above.

In the present invention, preferably, the higher frequency clock and the lower frequency clock are locked at the predetermined phase relationship through a phase-locked loop. Moreover, the higher frequency clock may be a core clock at which a microprocessor of a computer system is operated. Furthermore, the lower frequency clock may be a bus clock at which an input/output device, a display device, a data storage device, or an external memory of a computer system are operated. Therefore, with the generated synchronization signal, the method according to the present invention successfully achieves the synchronous data transfer between the higher frequency clock devices and lower frequency clock devices.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1A:
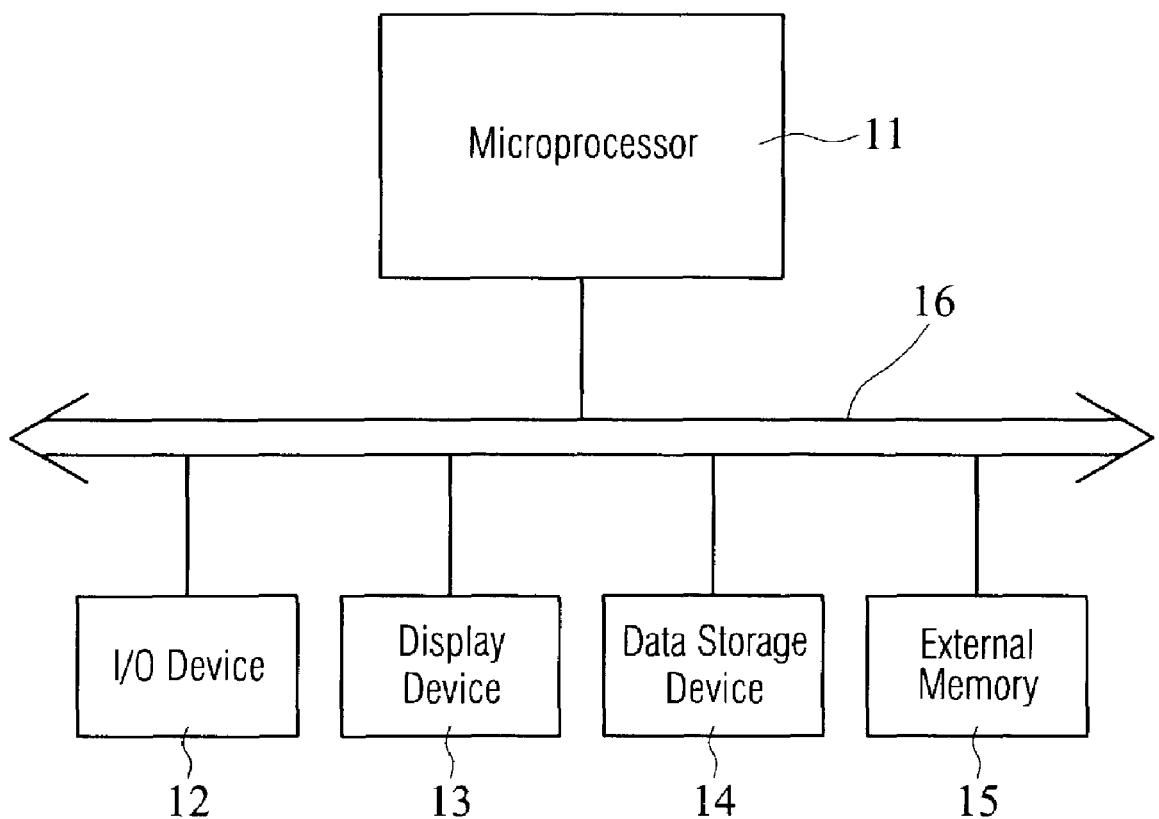
FIG. 1(a) is a schematic block diagram showing a configuration of a conventional computer system.
Figure 1B:
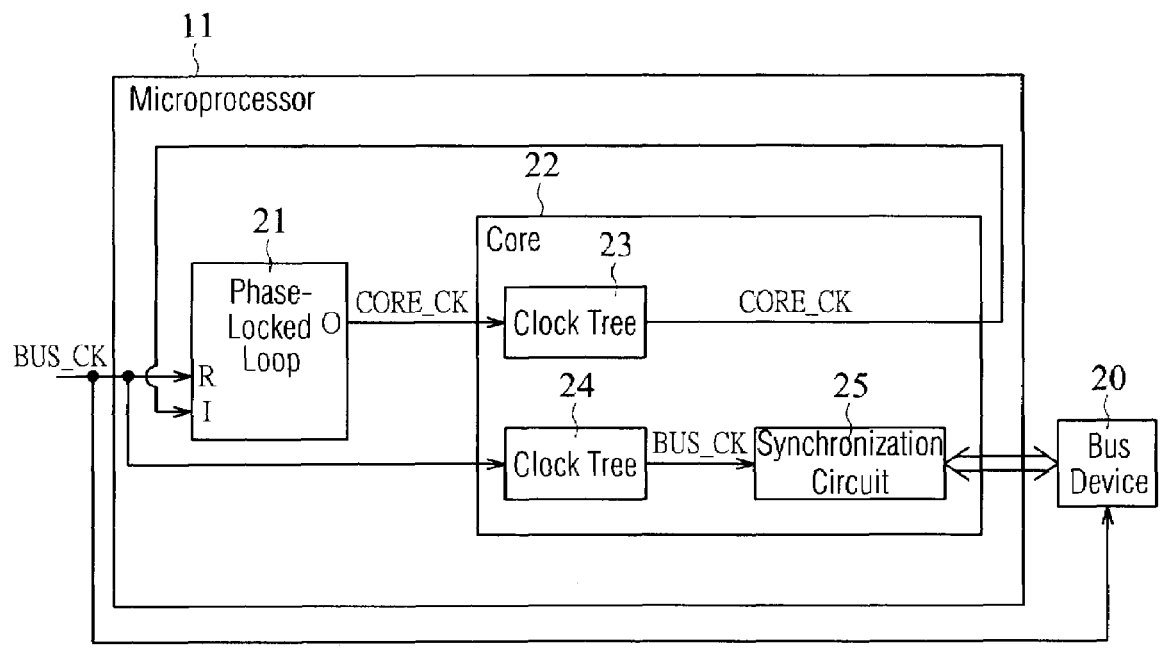
FIG. 1(b) shows an example of a conventional method of synchronizing dual clock frequencies.
Figure 1C:
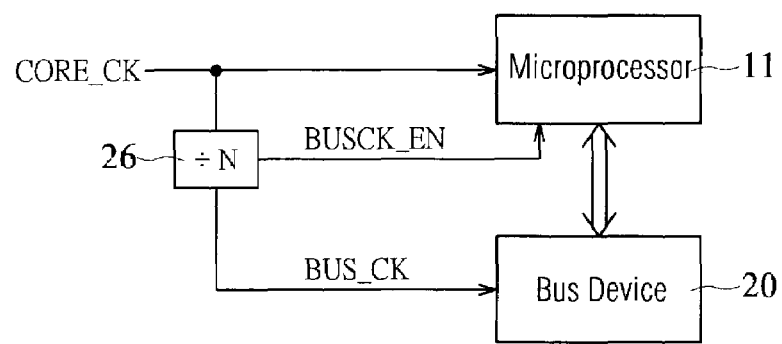
FIG. 1(c) shows another example of a conventional method of synchronizing dual clock frequencies.
Figure 2:
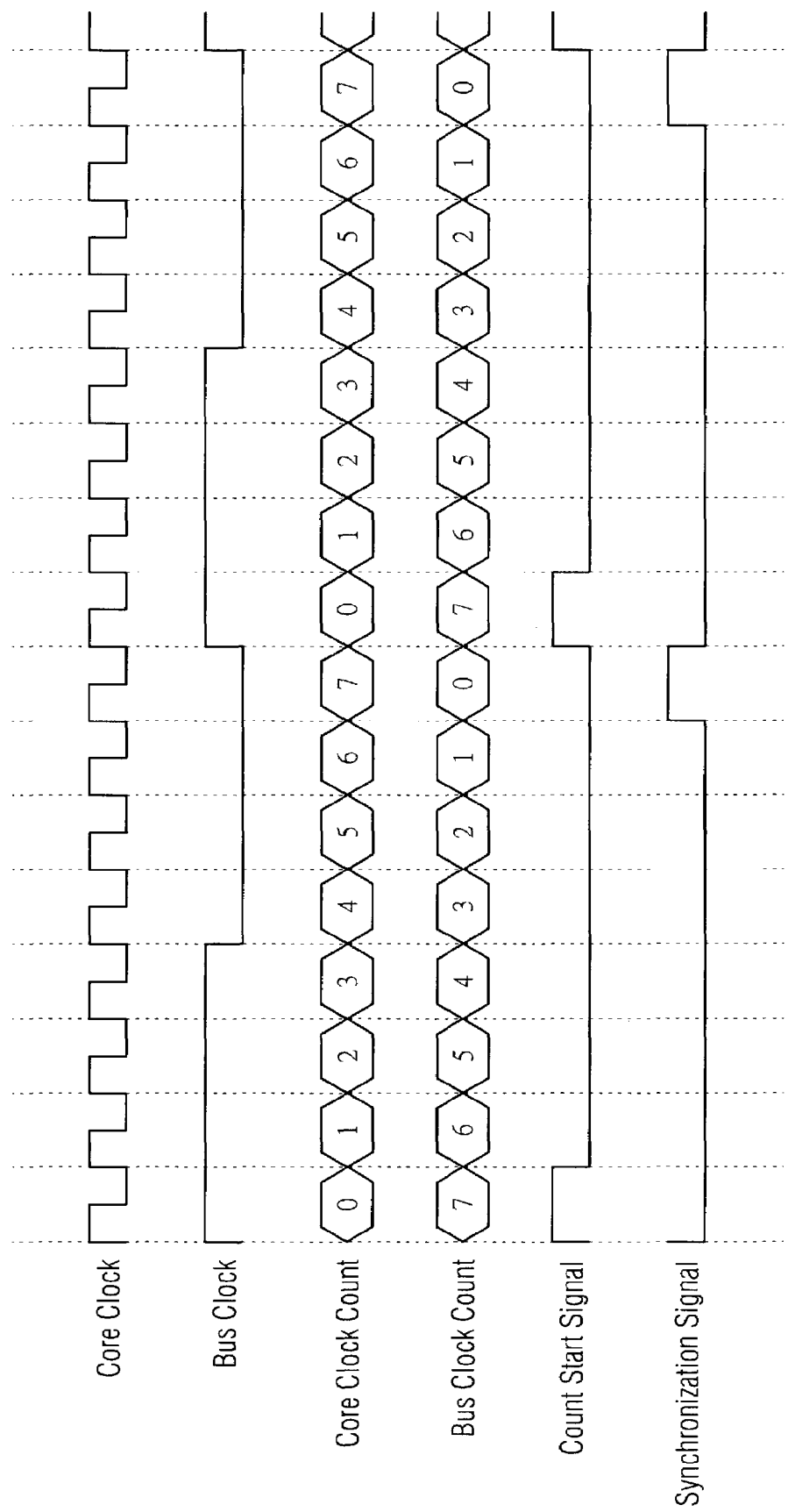
FIG. 2 is a timing chart showing an example of a method of synchronizing dual clock frequencies according to the present invention.

FIG. 2 is a timing chart showing an example of a method of synchronizing dual clock frequencies according to the present invention. Referring to FIG. 2, in this example is assumed that the frequency of the core clock is eight times as high as that of the bus clock. However, any people skilled in the art recognize that the present invention is not limited to the example shown in FIG. 2, but may be applied to any multiple relationships between the frequency of the higher frequency clock (core clock) and the frequency of the lower frequency clock (bus clock). With regard to the generation of the core clock and the bus clock, for example, a phase-locked loop or other well-known circuits may be used in a conventional way, and thus the detailed descriptions are omitted hereinafter.

The core clock and the bus clock are locked at a predetermined phase relationship between each other through the phase-locked loop. For example, as shown in FIG. 2, the core clock and the bus clock are locked at such a predetermined phase relationship that both of them have substantially coincident rising edges. Under the condition that the predetermined phase relationship is maintained between the core clock and the bus clock, a total number of pulses of the core clock occurring between two consecutive rising edges of the bus clock are calculated. In other words, this step determines the multiple relationship between the core clock frequency and the bus clock frequency. In the example shown in FIG. 2, there are 8 pulses of the core clock occurring between two consecutive rising edges of the bus clock since the frequency of the core clock is eight times as high as the frequency of the bus clock.

After the multiple relationship between the core clock frequency and the bus clock frequency is determined, a count start signal is generated each time when a rising edge of the bus clock occurs, thereby beginning to record the occurrence of each pulse of the core clock. In the present invention, two count parameters, i.e., a core clock count and a bus clock count, may be provided in response to the count start signal. Therefore, given that the pulses of the core clock are counted one by one starting from 0 and ending by 7 as a complete counting cycle, the core clock count is set to have a value of 0 while the bus clock count is set to have a value of 7 (=8−1) in response to the count start signal, as shown in FIG. 2.

Each time when a pulse of the core clock occurs, the value of the core clock count increments and the value of the bus clock count correspondingly decrements. In other words, the value of the core clock count and the value of the bus clock count are changed in accordance with the frequency of the core clock. Consequently, while the value of the core clock count increments from 0 to 7, the value of the bus clock count correspondingly decrements from 7 to 0. When the value of the bus clock is 0, a synchronization signal is generated for indicating occurrence of the predetermined phase relationship between the core clock frequency and the bus clock frequency. In the example shown in FIG. 2, the synchronization signal indicates that the rising edge of the core clock is substantially coincident to the rising edge of the bus clock.

After the synchronization signal is generated, since the rising edge of the bus clock occurs once again, the count start signal is also generated once again to set the value of the core clock count as 0 and the value of the bus clock count as 7 (=8−1). Repeating the steps mentioned above, when the value of the bus clock count decrements to 0 again, the synchronization signal is generated again for indicating occurrence of the predetermined phase relationship between the core clock frequency and the bus clock frequency. Therefore, the method according to the present invention successfully achieves the synchronization between the core clock and the bus clock with the generated synchronization signal.

Figure 3:
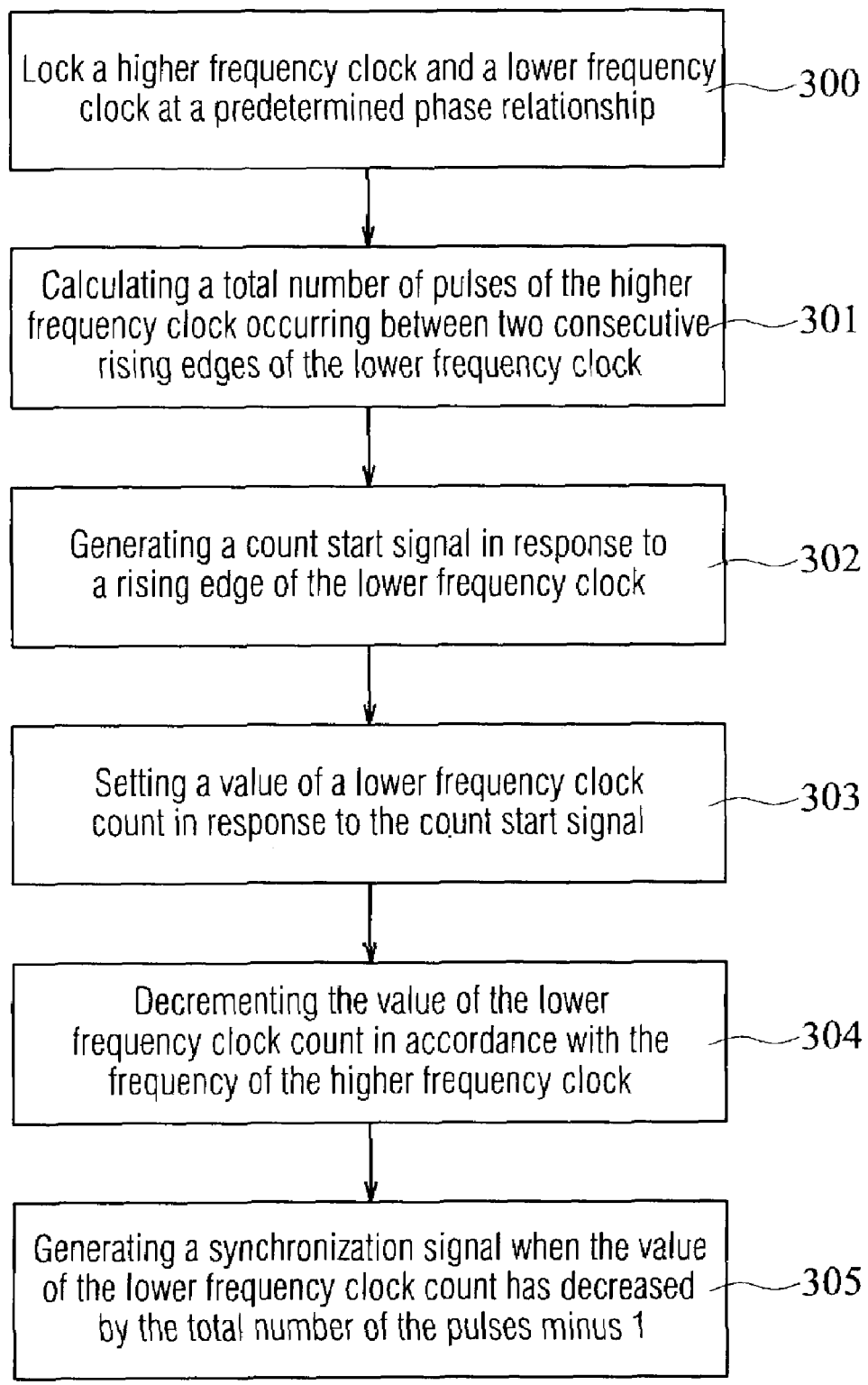
FIG. 3 is a flow chart showing a method of synchronizing dual clock frequencies according to the present invention.

In addition to the exemplary descriptions set forth above, the present invention may be understood more clearly with reference to FIG. 3, which is a flow chart showing the method of synchronizing dual clock frequencies according to the present invention. The method of synchronizing dual clock frequencies is provided to synchronize a higher frequency clock and a lower frequency clock, mainly including steps 300 to 305 shown in FIG. 3 and described in detail hereinafter.

In a step 300, a higher frequency clock and a lower frequency clock are locked at a predetermined phase relationship. In a step 301, a total number of pulses of the higher frequency clock occurring between two consecutive rising edges of the lower frequency clock are calculated. In a step 302, a count start signal is generated in response to a rising edge of the lower frequency clock. In a step 303, a value of a lower frequency clock count is set in response to the count start signal. In a step 304, the value of the lower frequency clock count decrements in accordance with the frequency of the higher frequency clock. In a step 305, a synchronization signal is generated when the value of the lower frequency clock count has decreased by the total number of pulses of the higher frequency clock occurring between two consecutive rising edges of the lower frequency clock minus 1, for indicating occurrence of the predetermined phase relationship between the higher frequency clock and the lower frequency clock. With the generated synchronization signal, higher frequency devices operated in accordance with the higher frequency clock and lower frequency devices operated in accordance with the lower frequency clock achieve synchronous data transfer between each other.

In addition to the main steps shown in FIG. 3, the method of synchronizing dual clock frequencies according to the present invention may further include in the step 303 a sub-step of setting a value of a higher frequency clock count in response to the count start signal, and in the step 304 a sub-step of incrementing the value of the higher frequency clock count in accordance with the frequency of the higher frequency clock.

Figure 4:
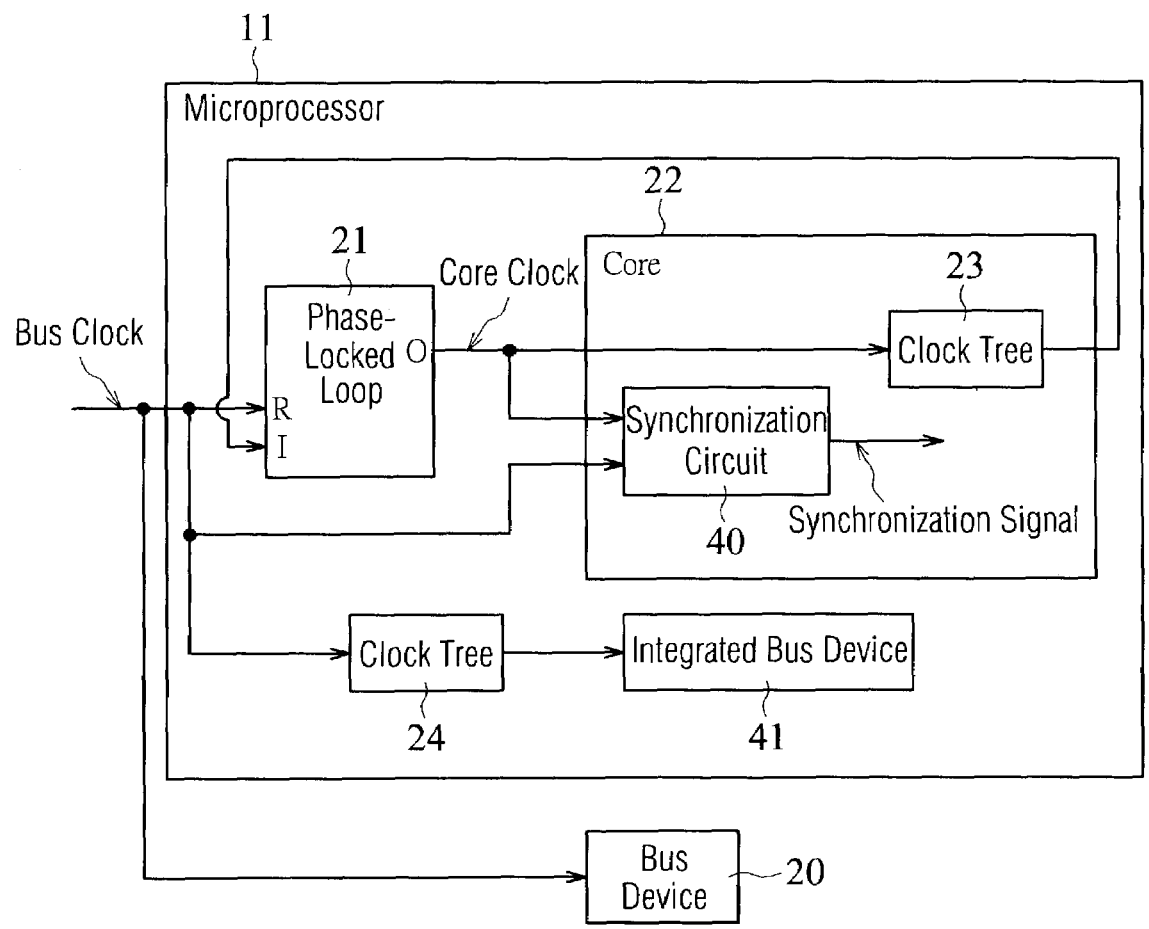
FIG. 4 is a schematic diagram showing a system employing a method of synchronizing dual clock frequencies according to the present invention.

FIG. 4 is a schematic diagram showing a system employing the method of synchronizing dual frequencies according to the present invention. Referring to FIG. 4, a bus clock is supplied to a bus device 20 as a clock frequency used therein, and is also input to a phase-locked loop 21 of a microprocessor 11 to thereby generate a core clock. As described above with reference to FIG. 2, the frequency of the bus clock and the frequency of the core clock have a predetermined multiple relationship. The core clock is input to a core 22 of the microprocessor 11 as a clock frequency used therein. Within the core 22 is arranged a clock tree 23 for distributing the core clock. In order to make the core clock and the bus clock synchronous, the core 22 may provided with a synchronization circuit 40 according to the present invention for receiving the core clock and the bus clock. With the method of synchronizing dual clock frequencies according to the present invention described above with reference to FIGS. 2 and 3, the synchronization circuit 40 makes the core clock and the bus clock synchronous, thereby generating a synchronization signal, as shown in FIG. 2. This synchronization signal is supplied to the bus device 20 such that the bus device 20 and the core device 22 achieve the desired synchronization. Therefore, the system employing the method of synchronizing dual clock frequencies is successfully accomplished. Incidentally, an integrated bus device 41 may be arranged inside the microprocessor 11, being contrary to the external bus device 20. In this case, the bus clock may also be supplied to the integrated bus device 41 through another clock tree 24 of the microprocessor 11.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A method of synchronizing a higher frequency clock and a lower frequency clock comprising steps of:
    locking the higher frequency clock and the lower frequency clock at a predetermined phase relationship;
    calculating a total number of pulses of the higher frequency clock occurring between two consecutive rising edges of the lower frequency clock;
    generating a count start signal in response to a rising edge of the lower frequency clock;
    setting a value of a lower frequency clock count in response to the count start signal;
    decrementing the value of the lower frequency clock count in accordance with a frequency of the higher frequency clock; and
    generating a synchronization signal when the value of the lower frequency clock count has decreased by the total number of pulses of the higher frequency clock occurring between two consecutive rising edges of the lower frequency clock minus 1, for indicating occurrence of the predetermined phase relationship between the higher frequency clock and the lower frequency clock.

2. The method according to claim 1, further comprising steps of:
    setting a value of a higher frequency clock count in response to the count start signal; and
    incrementing the value of the higher frequency clock count in accordance with the frequency of the higher frequency clock.

3. The method according to claim 2, wherein the value of the higher frequency clock count is set as 0.

4. The method according to claim 1, wherein the higher frequency clock and the lower frequency clock are locked at the predetermined phase relationship through a phase-locked loop.

5. The method according to claim 1, wherein the higher frequency clock is a core clock at which a microprocessor of a computer system is operated.

6. The method according to claim 1, wherein the lower frequency clock is a bus clock at which an input/output device, a display device, a data storage device, or an external memory of a computer system are operated.

7. A circuit of synchronizing a higher frequency clock and a lower frequency clock comprising:
    means for locking the higher frequency clock and the lower frequency clock at a predetermined phase relationship;
    means for calculating a total number of pulses of the higher frequency clock occurring between two consecutive rising edges of the lower frequency clock;
    means for generating a count start signal in response to a rising edge of the lower frequency clock;
    means for setting a value of a lower frequency clock count in response to the count start signal;
    means for decrementing the value of the lower frequency clock count in accordance with a frequency of the higher frequency clock; and
    means for generating a synchronization signal when the value of the lower frequency clock count has decreased by the total number of pulses of the higher frequency clock occurring between two consecutive rising edges of the lower frequency clock minus 1, for indicating occurrence of the predetermined phase relationship between the higher frequency clock and the lower frequency clock.

8. The circuit according to claim 7, further comprising steps of:
    means for setting a value of a higher frequency clock count in response to the count start signal; and
    means for incrementing the value of the higher frequency clock count in accordance with the frequency of the higher frequency clock.

9. The circuit according to claim 8, wherein the value of the higher frequency clock count is set as 0.

10. The circuit according to claim 7, wherein the higher frequency clock and the lower frequency clock are locked at the predetermined phase relationship through a phase-locked loop.

11. The circuit according to claim 7, wherein the higher frequency clock is a core clock at which a microprocessor of a computer system is operated.

12. The method according to claim 7, wherein the lower frequency clock is a bus clock at which an input/output device, a display device, a data storage device, or an external memory of a computer system are operated.

* * * * *